United States Patent [19]

Marcus

[11] 4,356,424
[45] Oct. 26, 1982

[54] PSEUDO-AC METHOD OF NONUNIFORMLY POLING A BODY OF POLYMERIC PIEZOELECTRIC MATERIAL AND FLEXURE ELEMENTS PRODUCED THEREBY

[75] Inventor: Michael A. Marcus, Fairport, N.Y.

[73] Assignee: Eastman Kodak Company, Rochester, N.Y.

[21] Appl. No.: 209,801

[22] Filed: Nov. 24, 1980

[51] Int. Cl.$^3$ .............................................. H01L 41/22
[52] U.S. Cl. ................................... 310/357; 310/800; 310/330; 361/233
[58] Field of Search ............... 310/357, 800, 330-332; 361/225, 226, 230, 233

[56] References Cited

U.S. PATENT DOCUMENTS

| | | | |
|---|---|---|---|
| 2,659,829 | 11/1953 | Baerwald | 310/358 X |
| 3,660,736 | 5/1972 | Igarashi et al. | 361/233 |
| 3,832,580 | 8/1974 | Yamamuro et al. | 310/800 X |
| 3,950,659 | 4/1976 | Dixon et al. | 310/332 X |
| 4,089,927 | 5/1978 | Taylor | 310/331 |
| 4,268,653 | 5/1981 | Uchidol et al. | 310/800 X |

OTHER PUBLICATIONS

"Flexure Mode Piezoelectric Transducers", by C. P. Germano; IEEE Transactions on Audio and Electroacoustics, vol. AU-19, No. 1, Mar., 1971.
"Importance of the Metal-Polymer Interface for the Piezoelectricity of Polyvinylidene Fluoride", Journal of Polymer Science; by H. Sussner and K. Dransfield; Polymer Physics Edition, vol. 16, 529-543, 1978, John Wiley and Sons, Inc.

*Primary Examiner*—William M. Shoop
*Assistant Examiner*—Peter S. Wong
*Attorney, Agent, or Firm*—Thomas H. Close

[57] ABSTRACT

A body of polymeric piezoelectric material is nonuniformly poled by: applying an electric field across the thickness of the body, from one surface to another surface, of a strength sufficient to induce nonuniform polarization in the material; and reversing the polarity of the poling field, thereby increasing the nonuniformity. In a preferred embodiment, the material is poled at an elevated temperature; the poling field is of sufficient strength such that a portion of the body near one surface is polarized in one direction and a portion of the body near the other surface is polarized in a substantially opposite direction; and the polarity of the poling field is reversed a plurality of times.

A flexure element comprising a continuous body of polymeric piezoelectric material nonuniformly poled according to the method of the present invention, exhibits strong flexure response to applied fields. Novel elements produced according to the preferred embodiment of the present invention are characterized by having polarization in one direction near one surface of the body and polarization in the opposite direction near the opposite surface of the body.

11 Claims, 20 Drawing Figures

PSEUDO-AC METHOD OF NONUNIFORMLY POLING A BODY OF POLYMERIC PIEZOELECTRIC MATERIAL AND FLEXURE ELEMENTS PRODUCED THEREBY

BACKGROUND OF THE INVENTION

1. Field of the Invention

The present invention relates in general to poling a body of polymeric piezoelectric material and more particularly, to poling such material to produce nonuniform polarization across the thickness of the body of material to render the body active piezoelectrically in a flexure mode.

2. Discussion Related to the Problem

A piezoelectric flexure mode device comprises a plurality of layers of material of different piezoelectric activity. Under the application of an external field across the thickness of such a device, relatively small expansions and/or contractions in the planes of opposing layers are converted into relatively large deflections of the layers out of their planes. Alternatively, if an external force is applied to the device, causing it to flex, a voltage is generated across the layers of the device. Piezoelectric flexure mode devices have found utility both as electrical-to-mechanical and mechanical-to-electrical transducers in such diverse applications as speakers; microphones; phonograph cartridges; motors; and accelerometers.

In its simplest form, a piezoelectric flexure mode device comprises a two-layer structure; one of the layers exhibiting piezoelectric activity and the other not. In the presence of an electric field (generally applied by means of thin electrodes fixed to the top and bottom surfaces of the device), the piezoelectric layer expands or contracts and, because the other layer, which is not piezoelectrically active, resists such expansion or contraction, the device flexes or bends. This form of flexure mode device is known as a unimorph. A more common form of flexure mode device, known as a bimorph, comprises two layers of piezoelectric material arranged so that when one expands, the other contracts, resulting in approximately twice the deflection for a given applied field as is exhibited by the unimorph.

Conventionally, piezoelectric flexure mode devices are manufactured by separately poling sheets of piezoelectric material, then bonding the sheets together in the desired configuration, using an adhesive. This technique has long been employed for making flexure mode devices from piezoelectric ceramic materials such as lead zirconate titanate (PZT). For more information on the structural details of such devices and some of their various uses, one may refer to the article by C. P. Germano, entitled "Flexure Mode Piezoelectric Transducers"; IEEE Transactions on Audio and Electroacoustics, Vol. AU-19, No. 1, March 1971.

More recently, polymeric piezoelectric materials such as polyvinylidene fluoride ($PVF_2$) have received considerable attention. As plastics, they are very attractive, since well developed conventional plastic manufacturing technology may be adapted to their economical manufacture. One of the major problem areas encountered in making polymeric piezoelectric flexure mode devices has been in bonding the layers to form the devices. Problems with adhesion of the bonding material to the piezoelectric material and proper matching of the mechanical impedance of the adhesive with the polymeric piezoelectric material have been encountered.

A way of overcoming the bonding problem in the manufacture of piezoelectric ceramic flexure mode devices is taught by U.S. Pat. No. 2,659,829 issued Nov. 17, 1953 to H. G. Baerwald. Baerwald discloses the technique of nonuniformly poling a single piece of piezoelectric material so that it behaves like a unimorph or a bimorph. According to the technique, a slab of piezoelectric ceramic material is first poled in one direction, then the poling is relaxed in a portion of the thickness of the slab by propagating a thermal pulse through the slab, to a limited depth, that momentarily raises the temperature of the material above its Curie point. The resulting structure comprises a continuous slab of material, resembling a monomorph, having one layer that is piezoelectrically active, and another layer with substantially no piezoelectric activity. In a further embodiment, the slab is then subjected to a poling field of the opposite polarity and of such a strength as to polarize the unpoled material, but not to reverse the polarity of the previously polarized material. The result is a device similar to a bimorph, having two layers poled in opposite directions in one continuous slab of material.

If this technique could be applied to polymeric piezoelectric material to produce a multilayer strucure in a continuous body of material, the bonding problem could be resolved. Unfortunately, polymeric piezoelectric materials such as $PVF_2$ do not exhibit a true Curie point below the melting point of the polymer. When the thermal depolarizing technique is attempted, all that results is a molten blob of plastic.

Some observers have noted that single films of $PVF_2$, poled in one direction under certain conditions of temperature and electric field exhibit flexure mode behaviour attributable to a nonuniform distribution of piezoelectric activity across the thickness of the film. (See the article by H. Sussner and K. Dransfield entitled "Importance of the Metal-Polymer Interface for the Piezoelectricity of Polyvinylidene Fluoride", Journal of Polymer Science: Polymer Physics Edition, Vol. 16, 529–543, 1978, John Whiley & Sons, Inc.). The nonuniformly poled piezoelectric material produced thereby, although exhibiting some flexure mode behavior, is not as active in the flexure mode as the devices produced by bonding multiple layers of differently poled material.

It is a purpose of the present invention to provide methods of nonuniformly poling polymeric piezoelectric material that increase the flexure mode activity in the resulting poled material over that observed in the material poled according to prior art methods.

SOLUTION TO THE PROBLEM—SUMMARY OF THE INVENTION

According to the method of the present invention, a body of polymeric piezoelectric material is nonuniformly poled by applying an electrical field across the thickness of the body, from one surface to another surface, of a strength sufficient to induce nonuniform polarization in the material, and reversing the polarity of the applied field, thereby increasing the nonuniformity of polarization. For a given poling field, temperature, and time, the nonuniformity of the polarization is a function, up to a limit, of the number of times that the polarity of the poling field is reversed. The greater the number of polarity reversals, the greater the nonuniformity. Because of the plurality of polarity reversals, this poling technique is called psuedo-AC poling. In a preferred embodiment, the material is poled at an elevated temperature; the poling field is of sufficient strength such that a portion of the body near one surface is polarized in one direction and a portion of the body near the other surface is polarized in substantially the opposite direction; and the polarity of the poling field is reversed a plurality of times. Novel flexure elements produced according to the preferred embodiment of the present invention, are characterized by having polarization in one direction near one surface of the body and polarization in the opposite direction near the opposite surface of the body.

DESCRIPTION OF THE DRAWINGS

The invention will be described with reference to the drawings, wherein:

FIGS. 4a–5a illustrate elevated temperature poling conditions according to the method of the present invention;

FIGS. 4b–5b are partial cross sectional views of material poled under the conditions illustrated in FIG. 4a and FIG. 5a respectively, showing qualitatively the resulting polarization in the top and bottom halves of the samples;

FIGS. 7a–9a illustrate room temperature poling conditions according to the methods of the present invention;

FIGS. 7b–9b are partial cross sections of material poled according to the conditions illustrated in FIGS. 7a–9a respectively and showing qualitatively the polarization in the top and bottom halves of the samples;

DESCRIPTION OF THE PREFERRED EMBODIMENT

Poling Apparatus

Figure 1:
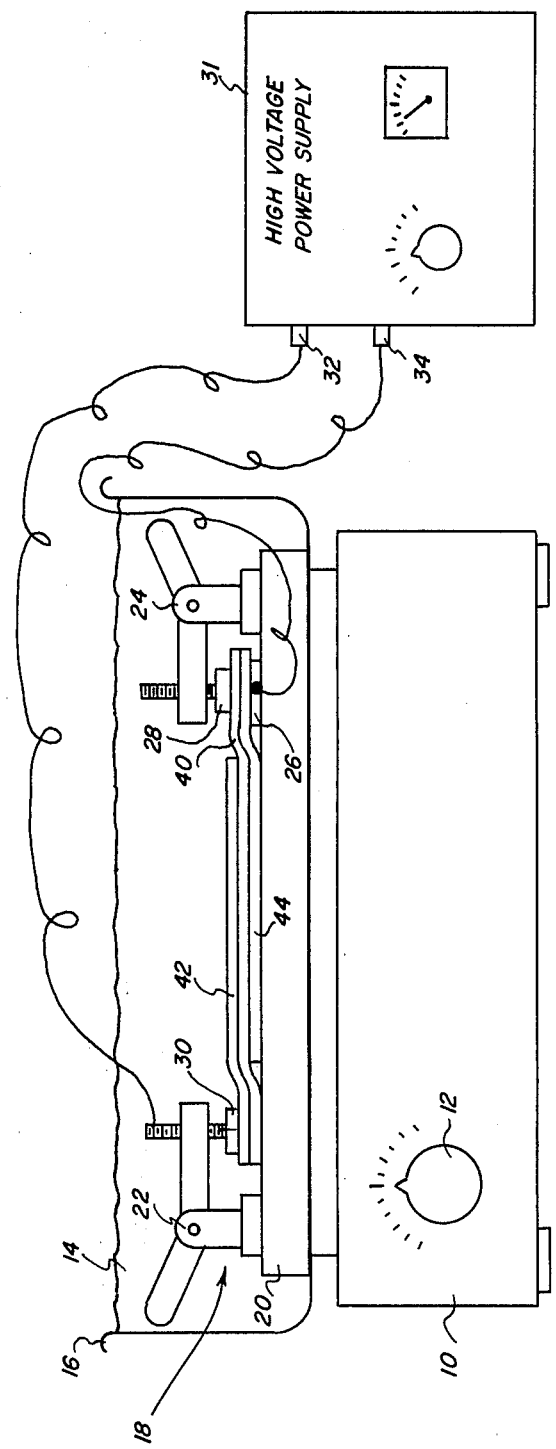
FIG. 1 is a schematic diagram showing the apparatus employed to pole polymeric piezoelectric material according to the present invention.

FIG. 1 shows the apparatus employed to pole polymeric piezoelectric material according to the present invention. The apparatus includes a hot plate 10 having an adjustable thermostat 12 for controlling the temperature of a paraffin oil bath 14 contained in a pan 16. A poling fixture generally designated 18 is immersed in the oil bath. The poling fixture 18 holds the samples during poling, and includes an electrically insulating base plate 20, a pair of toggle clamps 22 and 24 attached to the base plate, and a contact strip 26 disposed beneath a clamping foot 28 of toggle clamp 24. A clamping foot 30 of toggle clamp 22 is electrically conductive, while clampig foot 28 is electrically nonconductive. A high voltage power supply 31, including a switching network (not shown) for reversing the polarity of its outputs 32 and 34, provides the electrical power for poling. Output 32 is electrically connected to conductive clamping foot 30, and output 34 is electrically connected to contact strip 26. Samples of polymeric piezoelectric sheet material are prepared for poling by vacuum depositing aluminum electrodes on both sides of a rectangular piece of the material approximately 3 mm wide by 50 mm long. The aluminum electrode on one side of the sample does not extend all the way to one end, stopping about 5 mm short thereof. The electrode on the other side of the sample likewise ends about 5 mm short of the opposite end of the sample. The sample is placed in the poling fixture, between toggle clamps 22 and 24, and the ends are clamped to the base plate 20. A side view of the electroded sample, including the polymeric piezoelectric material 40, and upper and lower electrodes 42 and 44, respectively, is shown clamped in the poling fixture 18 in FIG. 1. The sample is placed so that conductive clamping foot 30 contacts the upper electrode 42 and contact strip 26 makes electrical contact with the lower electrode 44. In the areas where pressure is applied to the sample by clamping feet 28 and 30, the sample is electroded only on one side so that no field is applied across the sample in these areas.

The samples are poled by establishing the desired poling temperature, then applying the poling field with power supply 31. After poling, the field is removed and the sample returned to room temperature. The unpoled ends of the sample in the areas where the top or bottom electrode is missing, are then trimmed from the sample and the flexure mode activity of the sample is tested as follows.

Flexure Mode Measurements

Figure 2:
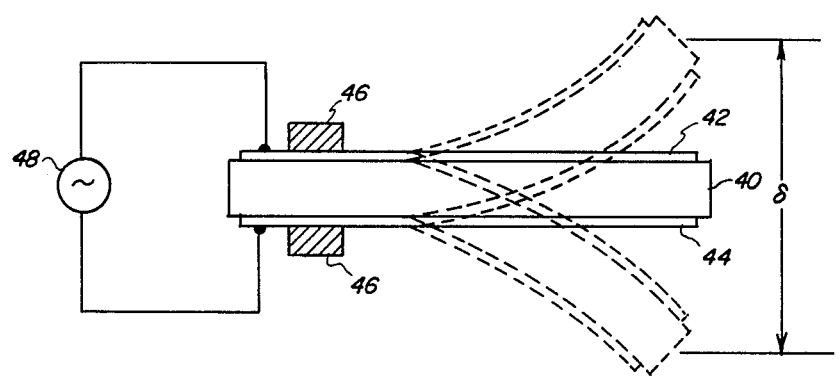
FIG. 2 is a schematic diagram illustrating the test for flexure mode activity performed on nonuniformity poled samples.

Samples of the polymeric piezoelectric material poled with the apparatus described above, are tested in the manner illustrated in FIG. 2 to determine the extent of their flexure mode activity. One end of the rectangular piece of electroded material 40 is clamped in a fixture 46 to form a cantilever piezoelectric bender element. A field of alternating polarity is applied across the piezoelectric material by connecting a 300 volt AC power supply 48 across the electrodes 42 and 44 as shown in FIG. 2. A sample exhibiting flexure mode activity deflects up and down as shown by the dotted lines in FIG. 2, in response to the alternating field. The amount of deflection $\delta$ experienced at the tip of the sample is proportional to the strength of the flexure mode activity of the sample. The maximum deflection $\delta$ produced at the tip of the sample 40 is measured and the measured deflection is translated to an effective piezoelectric constant by comparing the actual deflections produced to the calculated deflection of a theoretically perfect bimorph having perfect bonding between layers, i.e. zero bonding layer thickness and a perfect match of mechanical impedance between the piezoelectric material and the bonding material.

The theoretical deflection at the free end of such a perfect bimorph is given by:

$$\delta = 3/2 d_{31} VL^2/t^2 \quad (1)$$

where:
δ is the deflection produced at the tip;
$d_{31}$ is the piezoelectric constant that defines the strain in the plane of the material produced by an electric field perpendicular to the plane of the material;
V is the applied voltage;
L is the length of the bimorph; and
t is the overall thickness of the bimorph.

After a sample is tested according to the procedure described above to determine δ, equation (1) is solved to yield an effective $d_{31}$ ($d_{31}^{eff}$) for the sample. $d_{31}^{eff}$ can be used to compare the flexure mode activity of samples produced under various poling conditions.

EXAMPLES

In the following examples, a series of samples of 25 μm thick, biaxially stretched, capacitor grade, $PVF_2$ film were poled under various conditions of temperature, field strength, and poling time. The $PVF_2$ film was purchased from the Kureha Chemical Company. After the samples were poled, they were tested for flexure mode activity by the method described above with reference to FIG. 2. A $d_{31}^{eff}$ for each sample was then computed from the results of the test for comparison with the other samples.

High Temperature Poling Experiments

In the following three examples, samples were poled at 100° C. in a field of 0.3 MV/cm. After poling, the poling field was removed, the samples were allowed to return to ambient temperature, and the samples were tested for flexure mode activity.

EXAMPLE HT-1

Comparative Example

Figure 3A:
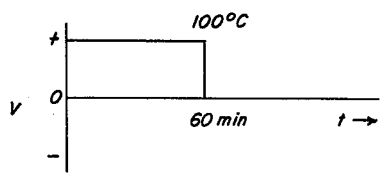
FIG. 3a illustrated high temperature poling conditions for a comparative example.
Figure 3B:
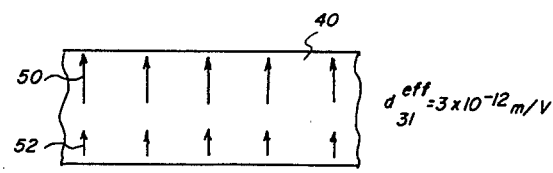
FIG. 3b is a partial cross-section of material poled under the conditions illustrated in FIG. 3a and showing qualitatively the resulting polarization in the top and bottom halves of the sample.

To establish a basis for comparison with samples poled according to the method of the present invention, a first sample was poled in one direction for one hour. The poling conditions are diagrammatically represented in FIG. 3a. When the sample was tested for flexure mode activity after poling, it was found to have a $d_{31}^{eff}$ of $3 \times 10^{-12}$ m/V (i.e. its deflection matched that of a perfect bimorph constructed from two sheets of film poled in opposite directions and each having a bulk $d_{31}$ of $3 \times 10^{-12}$ m/V). FIG. 3b is a schematic diagram of a partial cross section of a film 40 poled according to Example HT-1. The arrows in FIG. 3b are intended to represent, qualitatively, the average amounts and polarities of piezoelectric activity induced in the top and bottom halves of the sample by the poling procedure. The longer arrows 50 indicate a stronger average activity in the top half of the sample, and the shorter arrows 52 indicate a weaker average activity in the bottom half of the sample. Arrows 50 and 52 are shown pointing in the same direction, indicating that the direction of piezoelectric activity is the same throughout the sample. For piezoelectric material poled nonuniformly in only one direction, any piezoelectric activity in the more weakly poled half of the material will cancel part of the activity contributing to bending in the more strongly poled half.

EXAMPLE HT-2

The Invention

Figure 4A:
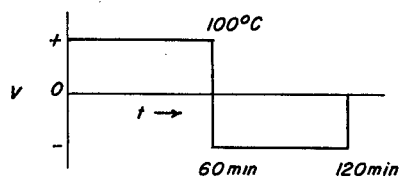
Figure 4B:
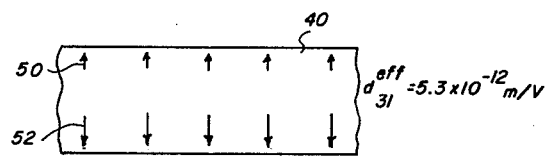

A second sample, poled in accordance with the pseudo-AC poling method of the present invention, was likewise poled for one hour, after which the field was reversed in polarity and the sample was poled in the opposite direction for an additional hour. Although the polarity of the field was reversed by reversing the polarity of the power supply 30, the field could also be reversed by removing the sample from the poling apparatus and turning the sample over. The poling conditions are illustrated in FIG. 4a. The poled sample was tested and found to have a $d_{31}^{eff}$ of $5.3 \times 10^{-12}$ m/V, a definite improvement over the comparative example. FIG. 4b qualitatively illustrates the direction and relative strengths of the average piezoelectric activity in the top and bottom halves of the sample. Note that the direction of the average piezoelectric activity in the bottom half of the sample is reversed from that in the top half, thereby resulting in a relatively strong flexure mode response. This configuration of poled polymeric piezoelectric material with reversed average polarity in the top and bottom halves of a continuous body of material is believed to be a novel structure, first produced by the pseudo-AC method of poling.

EXAMPLE HT-3

The Invention

Figure 5A:
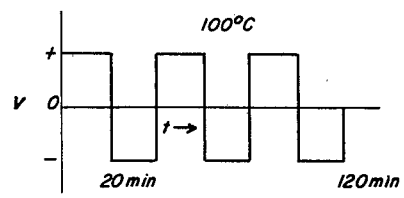
Figure 5B:
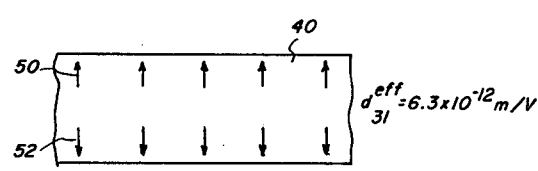

A third sample was prepared using the pseudo-AC method by poling for a total time of 2 hours, as in Example 2, but the polarity of the poling field was reversed every twenty minutes. FIG. 5a illustrates the poling conditions. The flexure mode activity of the sample was measured and it was found to have a $d_{31}^{eff}$ of $6.3 \times 10^{-12}$ m/V, an even further improvement over the comparative example HT-1. Apparently, up to a limit, the nonuniformity of piezoelectric activity in the poled material increases with the number of polarity reversals. FIG. 5b illustrates the amounts and directions of the piezoelectric activity induced by the poling procedure. Again the polarity of activity reverses from top to bottom.

Room Temperature Poling Experiments

Although the maximum polarization nonuniformity has been achieved by poling at elevated temperatures, (e.g. in the range from about 60° C. to about 120° C. in the fields of about 0.6 MV/cm to about 0.3 MV/cm, respectively), it has been found that significant improvement in flexure mode activity can be achieved by the pseudo-AC poling method of the present invention, even at room temperature (21° C.). In the following examples, the samples were poled at 21° C. (room temperature) in a field of 1 MV/cm.

EXAMPLE RT-1

Comparative Example

Figure 6A:
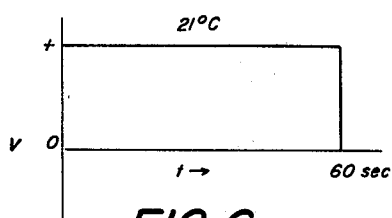
FIG. 6a illustrates room temperature poling conditions for a comparative example.
Figure 6B:
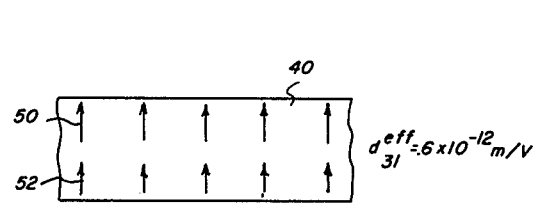
FIG. 6b is a partial cross section of material poled under the conditions illustrated in FIG. 6a qualitatively showing piezoelectric activity in the top and bottom halves of the sample.

A first sample was poled for comparison with later samples by poling in one direction for 60 seconds (see FIG. 6a). The measured $d_{31}^{eff}$ was found to be $0.6 \times 10^{-12}$ m/V. FIG. 6b shows a partial cross section of the poled sample, qualitatively indicating the average polarization in the top and bottom halves of the sample.

EXAMPLE RT-2

Invention

Figure 7A:
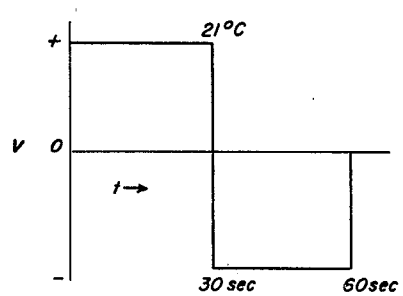
Figure 7B:
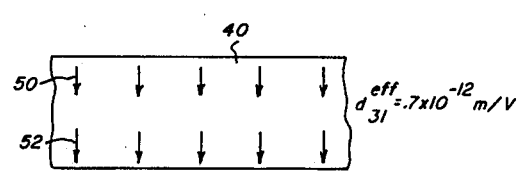

A second sample was poled using the pseudo-AC method according to the present invention by reversing the polarity of the poling field once after 30 seconds and poling in the reversed field for an additional 30 seconds (see FIG. 7a). The measured $d_{31}{}^{eff}$ was found to be $0.7 \times 10^{-12}$ m/V. FIG. 7b qualitatively illustrates the directions and amounts of polarization in the top and bottom halves of the sample. As indicated in FIG. 7b, both halves of the sample are probably polarized in the same direction, although some improvement in flexure mode activity was noted over the comparative example.

EXAMPLE RT-3

Invention

Figure 8A:
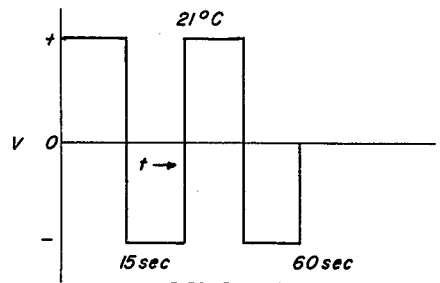
Figure 8B:
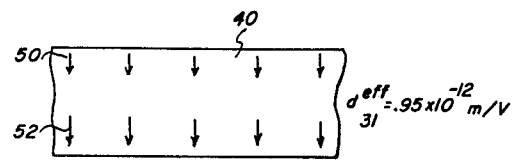

A third sample was poled, using the pseudo-AC method, for a total of 60 seconds, by reversing the polarity of the poling field every 15 seconds as illustrated in FIG. 8a. The poled film was found to have a $d_{31}{}^{eff}$ of $0.95 \times 10^{-12}$ m/V. As illustrated in FIG. 8b, the piezoelectric activity seems to be in the same direction throughout the sample although more flexure mode activity was produced by increasing the number of field reversals.

EXAMPLE RT-4

Invention

Figure 9A:
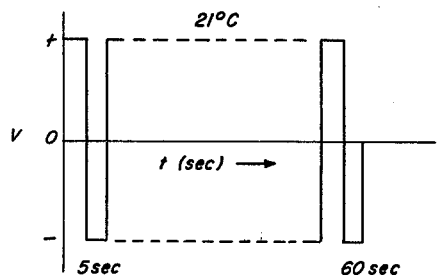
Figure 9B:
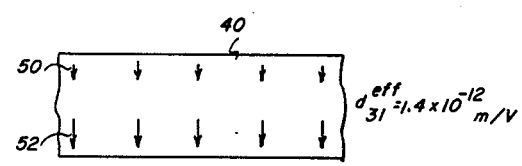

A fourth sample was poled using the pseudo-AC poling method of the present invention, again for a total of 60 seconds but reversing the polarity of the field every 5 seconds, as shown in FIG. 9a. The poled film was tested, revealing a $d_{31}{}^{eff}$ of $1.4 \times 10^{-12}$ m/V. This represented at least a two-fold improvement in flexure mode activity over the comparative Example RT-1. Apparently, however, the direction of piezoelectric activity was still the same throughout the sample, as illustrated in FIG. 9b.

EXAMPLE RT-5

Comparative Example

Figure 10A:
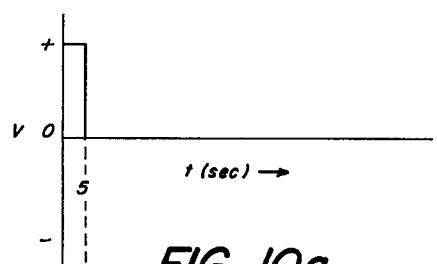
FIG. 10a illustrates the poling conditions for a comparative example.
Figure 10B:
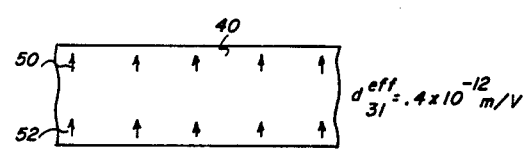
FIG. 10b is a partial cross section of material poled according to the conditions illustrated in FIG. 10a showing qualitatively the polarization in the top and bottom halves of the sample.

To verify that the progressively shorter durations of applied poling field represented by Examples RT-2 through RT-4 were not responsible for the successive increase in flexure mode activity, a sample was poled in one direction for 5 seconds (see FIG. 10a). The resulting $d_{31}{}^{eff}$ was found to be $0.4 \times 10^{-12}$ m/V; much lower than the $d_{31}{}^{eff}$ of $1.4 \times 10^{-12}$ m/V produced in Example RT-4. A partial cross section of the poled material and the average polarization in the top and bottom halves of the sample are shown in FIG. 10b.

EXAMPLE RT-6

Invention

Figure 11A:
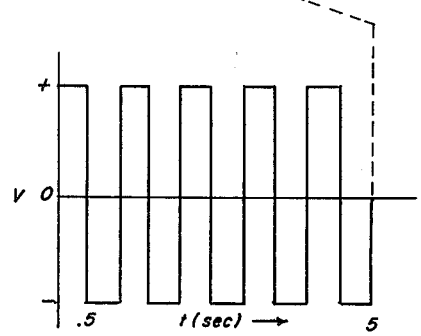
FIG. 11a illustrates an example of poling conditions according to the present invention.
Figure 11B:
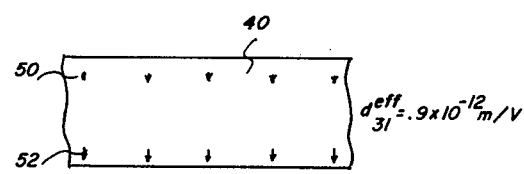
FIG. 11b is a partial cross section of a sample of material poled under the conditions illustrated in FIG. 11a qualitatively showing average polarization in the top and bottom halves of the sample.

Another sample was poled for a total of 5 seconds, but according to the pseudo-AC method of the present invention, the polarity of the poling field was reversed every 0.5 seconds (see FIG. 11a). The resulting measured $d_{31}{}^{eff}$ was found to be $0.9 \times 10^{-12}$ m/V, indicating that at least over an order of magnitude, the pseudo-AC method according to the present invention is relatively insensitive to the duration of each pulse, and that a plurality of polarity reversals increases the nonuniformity of the remaining polarization. FIG. 11b illustrates what is believed to be the resulting pattern of polarization throughout a portion of the sample.

SUMMARY OF RESULTS

For $PVF_2$, it has been observed, that as the poling temperature is increased, the field required to induce the maximum poling nonuniformity is decreased. However, poling temperatures much above about 150° C. cannot be employed because the melting point of $PVF_2$ is about 160° C. At about 150° C., the greatest nonuniformity is produced with fields of about 0.2 MV/cm. With poling temperatures of about 100° C., the most nonuniformity is produced with poling fields of about 0.3 MV/cm, whereas at room temperature (~21° C.), poling fields of about 1 MV/cm produce the most nonuniformity. The nonuniformity produced at room temperature is generally less than that produced at higher temperatures, and poling temperatures of about 100° C. are presently preferred for practicing the invention. At poling temperatures much below room temperature, the field strength required to produce any poling at all, tends to produce uniform poling, and there does not appear to be a substantial operating range where nonuniform poling can be induced.

In all cases studied, when the poling field was increased above a certain level, the piezoelectric activity distribution became quite uniform, and the pseudo-AC poling technique of the present invention failed to result in any substantial increase in nonuniformity.

Poling nonuniformity does not appear to be a strong function of total poling time. The differences in flexure mode activity observed in samples poled under similar conditions for 1 minute and 1 hour were only about 30%. In all cases observed, however, the poling nonuniformity was increased, up to a limit, by increasing the number of polarity reversals in the poling field.

Sample thickness has been observed to be a factor in determining the optimum poling conditions for nonuniform poling. Generally, thicker samples require lower average poling fields to produce maximum poling nonuniformity.

The invention has been described in detail with reference to preferred embodiments thereof, however, it will be understood that variations and modifications can be effected within the spirit and scope of the invention. For example, although the examples have shown equal poling fields applied in opposite directions for equal amounts of time, the field strengths and relative durations could be varied within the spirit and scope of the present invention. Further, although the invention was described with reference to $PVF_2$, any other known polymers having piezoelectric properties may be used, for example, a copolymer of vinylidene fluoride and a monomer polymerizable with vinylidene fluoride, such as tetrafluoroethylene, vinylidene fluorochloride, trifluoroethylene, vinyl fluoride, chlorotrifluoroethylene, or propylene hexafluoride.

I claim:

1. A method of nonuniformly poling a body of polymeric piezoelectric material, comprising the steps of:
    applying across a thickness of the body, an electric field of a strength sufficient to induce nonuniform polarization in the material; then reversing the polarity of the applied field, thereby increasing the nonuniformity of the polarization of the material.
2. A method of nonuniformly poling a continuous body of polymeric piezoelectric material, comprising the steps of:

heating the body to a poling temperature, applying an electric field across a thickness of the body from one surface to another surface then reversing the polarity of the applied field a plurality of times, the applied field being of a strength sufficient to induce nonuniform polarization in the material at the poling temperature and the combination of poling temperature and applied field being such that a portion of the body near one surface thereof is polarized in a first direction and a portion of the body near the other surface is polarized in an opposite direction.

3. The invention as claimed in claim 2 wherein the material is $PVF_2$, the poling temperature is in a range from about 21° C. to about 150° C., and the applied field is in a range from about 1 MV/cm to about 0.2 MV/cm.

4. The invention as claimed in claim 2 wherein the material is $PVF_2$, the poling temperature is approximately 100° C. and the applied field is approximately 0.3 MV/cm.

5. A body of nonuniformly poled polymeric piezoelectric material produced by the process of applying across the thickness of the body, an electric field of a strength sufficient to induce nonuniform polarization in the material, then reversing the polarity of the applied field.

6. A body of nonuniformly poled polymeric piezoelectric material produced by the process of heating the body to a poling temperature, applying an electric field across the thickness of the body from one surface to another surface thereof, then reversing the polarity of the applied field a plurality of times, said nonuniformly poled body being characterized by having polarization in a first direction in a portion near one surface thereof and polarization in a second direction opposite to said first direction near the other surface thereof.

7. The invention as claimed in claim 6 wherein said material is $PVF_2$, said poling temperature is approximately 100° C., and said applied field is approximately 0.3 MV/cm.

8. A flexure element comprising a continuous body of nonuniformly poled polymeric piezoelectric material having an average polarization in a first direction in a portion of the body near one side thereof, and having an average polarization in a second direction opposite to said first direction in a portion of said body near the opposite side thereof.

9. The invention as claimed in claim 8 wherein said material is $PVF_2$.

10. A flexure element comprising a sheet of nonuniformly poled polymeric piezoelectric film having an average polarization in a portion near one surface thereof oriented in a direction outward from said surface and having an average polarization in a portion near the opposite surface thereof likewise oriented in an outward direction.

11. The invention as claimed in claim 10 wherein said material is $PVF_2$.

* * * * *